United States Patent [19]

Ho et al.

[11] Patent Number: 4,720,401
[45] Date of Patent: Jan. 19, 1988

[54] ENHANCED ADHESION BETWEEN METALS AND POLYMERS

[75] Inventors: Paul S. C. Ho, Chappaqua, N.Y.; Peter O. Hahn, Burghausen, Fed. Rep. of Germany; Harry Lefakis, Shrub Oak; Gary W. Rubloff, Katonah, both of N.Y.

[73] Assignee: International Business Machines Corporation, Armonk, N.Y.

[21] Appl. No.: 914,564

[22] Filed: Oct. 2, 1986

Related U.S. Application Data

[63] Continuation of Ser. No. 690,567, Jan. 11, 1985, abandoned.

[51] Int. Cl.$^4$ .............................................. C23C 16/06
[52] U.S. Cl. .................. 427/250; 204/192.15; 427/123; 427/124; 427/316
[58] Field of Search ............ 427/250, 316, 383.1, 427/123, 124; 204/192 C, 192 SP, 192 D

[56] References Cited

U.S. PATENT DOCUMENTS

| | | | |
|---|---|---|---|
| 2,884,337 | 4/1959 | Homer et al. | 427/316 |
| 2,897,091 | 7/1959 | Homer et al. | 427/316 |
| 3,881,049 | 4/1975 | Brandt et al. | 427/306 |
| 3,914,471 | 10/1975 | Cobb et al. | 427/316 |
| 4,015,049 | 3/1977 | Yoda et al. | 427/250 |
| 4,152,195 | 5/1979 | Bahrle et al. | 427/250 |
| 4,386,116 | 5/1983 | Nair et al. | 427/250 |

FOREIGN PATENT DOCUMENTS 53-82878  7/1978  Japan ................... 427/250

Primary Examiner—Sadie L. Childs
Attorney, Agent, or Firm—Jackson E. Stanland

[57] ABSTRACT

A technique is described for increasing the adhesion between metals and organic substrates, where the metals are those which normally only very weakly bond to the substrate. These metals include Ni, Cu, Al, Ag, Au, Ta, Pt, Ir, Rh, Pd, Zn, and Cd. The organic substrates include mylar, polyimides, polyesters, polyethylene, polystyrene, etc. Enhanced adhesion occurs when intermixing between the depositing metal atoms and the substrate is optimized to a depth less than about 1000 angstroms into the substrate. This occurs in a critical substrate temperature range of about (0.6–0.8) $T_c$, where $T_c$ is the curing temperature of the substrate. The deposition rate of the metal atoms is chosen such that the arrival rate of the metal atoms at the surface of the substrate is comparable to or less than the rate of diffusion of metal atoms into the substrate. This provides optimum intermixing and maximum adhesion.

17 Claims, 6 Drawing Figures

ENHANCED ADHESION BETWEEN METALS AND POLYMERS

This application is a continuation of Ser. No. 690,567, filed Jan. 11, 1985, now abandoned.

FIELD OF THE INVENTION

This invention relates to techniques for improving adhesion between polymers, and more particularly to improved adhesion between organic polymer substrates and metals which have very weak chemical bonding with the constituents of these substrates.

BACKGROUND ART

In the microelectronics industry, in particular, thin films of metals are often deposited on insulating substrates, where the insulators are typically organic polymers, such as polyimide and other types of plastics and polyesters. In current microelectronics technology, polymer materials and their interfaces (such as those with metals) play a very important role. With the trend toward higher speed semiconductor devices and higher density circuits on semiconductor chips, signal delays on chips have become comparable to or shorter than those associated with the packaging of the chip-i.e., wiring between chips located on the same or different substrates, cards, boards, etc. As the packaging delays have become comparable to chip delays, new packaging schemes utilizing thin film metal interconnections electrically isolated by polymeric materials have been adopted. These techniques have been motiviated by cost and reliability considerations, as well as by the required compatability with manufacturing automation.

The use of polymers offers a number of intrinsic advantages in microelectronics applications. Polymers are low in cost and relatively easy to handle, and in addition offer a variety of desireable properties. These properties include flexibility, planarizability and stability. The polymers generally can be tailored to match the needs of the particular application by using polymer chemistry and engineering. Additionally, they can be processed readily in a variety of ways, such as plasma etching, reactive ion etching, and laser ablation. Relatively high temperature stability is especially attractive for those applications where annealing steps are involved in the processing. For example, polyimide is a widely used insulator since it is stable to approximately 400° C.

The miniaturization of semiconductor devices and other microelectronic devices requires a further reduction of device dimensions and multilevel wiring schemes on the chip. The insulators used between these wiring levels have to fulfill a number of requirements, which are generally well met by various types of organic insulators, including polymers. These insulators must be applied with good thickness uniformity, have excellent electrical integrity and thermal stability, and exhibit good adhesion to the metal layers they keep separated. This last problem-that of metal/polymer adhesion-has not been entirely successfully addressed by the industry.

Many metals bond very well to polymer-type substrates, such as polyimide. The metals which generally bond well to provide good adhesion are those which form relatively strong chemical bonds to the polyimide atomic constituents (carbon, oxygen, nitrogen, and hydrogen). However, many metals are very weakly interacting with the microscopic constituents of these types of substrates and do not bond well. For these metals, the adhesion problem described previously has not been solved.

Various treatments have been utilized in the prior art to enhance adhesion between metals and polymers. These techniques include roughening of the polymer surface and chemical pre-sensitizing prior to the deposition of a metal, as described in U.S. Pat. No. 3,881,049.

Another technique for depositing copper on polyimide was described by M. Terasawa et al at the International Symposium on Hybrid Manufacturing (ISHM), Oct. 31–Nov. 2, 1983, Philadelphia. In this technique, copper and aluminum are deposited by ion-plating using electron beam deposition in order to enhance the conductor adhesion. Chromium is used as a substrate metal to provide enhanced adhesion between the copper or aluminum and the Cr-coated substrate.

The use of heating to promote adhesion between metals and polymers is well known in the art. For example, reference is made to U.S. Pat. No. 4,152,195, in which a polyimide resin layer is partially cured by heating to approximately 200° C. for 20 minutes and then to approximately 275° C. for 30 minutes, prior to metal deposition. After a metal is vapor deposited on the partially cured polyimide, the entire structure is fully cured by heating to 350° C. This reference also describes other techniques to improve the adherence of aluminum layers to polyimide surfaces. These prior techniques include roughening of the polyimide surface by sputtering, by chemical solutions, or by the presence of oxygen atoms and electrical discharges which partly burn the polyimide surfaces. Fully curing the polyimide prior to metal deposition is also described in this reference.

Another reference which describes improved adhesion between copper and polyimide is U.S. Pat. No. 4,386,116. In this reference, the polyimide is heated to a temperature of approximately 360°–380° C. during the evaporation of chrome-copper. A critical substrate temperature of 360°–380° C. was required to produce copper-copper interface vias with good electrical conductivity and to provide optimum polyimide stability. It was suggested that a chemical reaction between copper and nitrogen in the polyimide provided the necessary adhesion.

In the prior art, it has been the situation that the polyimide substrate is heated to a temperature as high as possible, that is, to a temperature approximating the c-curing temperature of the polyimide. For example, chromium is generally deposited on polyimide at high temperatures, such as approximately 360°–380° C., in order to provide enhanced adhesion. Thus, the teaching of the prior art has been to use temperatures as high as possible in order to promote enhanced bonding of a metal to a polymer substrate, within the limits of the temperature stability of the polyimide. This approach has been used both for metals which chemically bond (i.e., strongly interact) with the polymer substrate as well as those which are only very weakly interacting with the substrate.

In the course of applicants' experimentation, it has been discovered that, for those metals which have only very weak bonding with polymer substrates, a critical range of substrate temperatures and deposition rates exists in which adhesion can be maximized. Applicants have discovered that intermixing of the depositing metal atoms and the polymer substrate occurs at the interface as a result of heating. This intermixing is increased when the metal atoms have sufficient time to diffuse into the polymer substrate before combining with further incoming metal atoms. The time required for diffusion into the polymer substrate is shorter at higher substrate temperatures. Thus, the substrate temperature, deposition rate, and annealing time are adjusted so that diffusion of the metal atoms (i.e., intermixing) into the polymer substrate occurs prior to the combination of the metal atoms with other metal atoms. If the deposition rate of the arriving metal atoms is small with respect to the diffusion rate of metal atoms into the substrate, significant intermixing will occur. However, applicants have discovered that the amount of intermixing has to be optimized in order to maximize adhesion. It has also been found that, contrary to the teaching of the prior art, a substrate temperature less than the temperature at which the polymer cures produces optimum intermixing and, therefore, maximum adhesion. For example, in the case of copper or nickel deposition onto polyimide, a substrate temperature of approximately 240°–280° C. provides maximum adhesion. Generally, the optimal temperature range is approximately $(0.6-0.8) T_c$, where $T_c$ is the curing temperature of the polymer substrate.

Accordingly, it is a primary object of the present invention to provide a technique for depositing selected metals onto polymer substrates with improved adhesion, where the metals are those which only weakly intrinsically bond to the atomic constituents of the polymer substrate.

It is another object of the present invention to provide improved polymer substrate-metal structures which exhibit improved adhesion, where the metal overlayers are those which normally only weakly bond to the substrates.

It is another object of the present invention to provide improved adhesion of Ni, Cu, and Al to polymer substrates.

It is another object of the present invention to maximize the adhesion between intrinsically weakly bonding metals and organic substrates, which technique can be readily adapted into manufacturing lines.

It is another object of this invention to provide improved packaging techniques and microelectronic structures having enhanced adhesion at metal-polymer interfaces.

It is another object of this invention to provide structures including interfaces between polymers and metals that intrinsically bond very weakly to the polymer constituents, where enhanced adhesion is produced between the metals and the polymers.

DISCLOSURE OF INVENTION

This invention relates to the provision of metals on organic substrates where there is enhanced adhesion between the metals and the substrates. These metals are those which intrinsically weakly interact with the atomic constituents of the organic substrates, where the substrates include the commonly used polymer-type substrates. It has been found that optimum intermixing between the metals and the substrates and presumably optimum concentration gradients of metals into the organic substrates, and therefore increased adhesion, occur when the substrate temperature and arrival rate of metal atoms on the substrate are so chosen that the arrival rate of metal atoms is small with respect to the diffusion rate of metal atoms into the substrate.

Contrary to the teaching of the prior art, enhanced adhesion occurs at a temperature less than the curing temperature of the substrate. Generally, the substrate temperature during deposition of the metal is approximately 0.6–0.8 of the substrate curing temperature. If the time for metal atoms to diffuse into the substrate is approximately the same or less than the time required for another metal atom to arrive in the vicinity of a deposited metal atom, diffusion into the substrate will predominate, and strong intermixing will occur. However, the amount of intermixing has to be optimized to produce maximum adhesion.

It has further been found that the amount of intermixing into the substrate can be controlled by varying the time during which the polymer is maintained at the deposition temperature. For optimum adhesion, diffusion should be over a distance of approximately 1000 angstroms, and can be as little as about a few hundred angstroms. Thus, the substrate temperature and deposition rate are adjusted so that optimum intermixing occurs into the substrate, to a distance less than about 1000 angstroms. After this intermixing and after a few atomic layers (30–50 angstroms) of the metal are deposited on the substrate surface, the deposition conditions can be changed.

The metals which can be deposited in this manner are those which weakly bond to the substrate, and include metals such as Ni and Cu. Although Al is somewhat more chemically reactive with the organic substrates than these other metals, it has been found that it also follows these general guidelines for increased intermixing and therefore enhances adhesion. Other metals which can be deposited in this manner to provide maximum adhesion include Ag, Au, Ta, Ir, Rh, Pd, Pt, Zn, and Cd. The organic substrates are those which are polymer-like substrates including polyimide, mylar (a trademark of E. I. dePont de Nemours, Inc.), polyesters, plastics, epoxies, polyethylene, polystyrene, etc.

These and other objects, features, and advantages will be apparent from the following more particular description of the preferred embodiments.

BEST MODE FOR CARRYING OUT THE INVENTION

Figure 1:
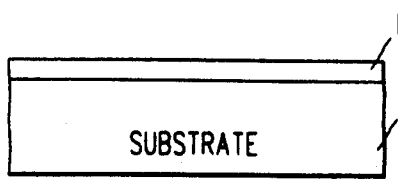
FIG. 1 is an illustration of a structure in which a thin metallic layer is located on an organic substrate, such as a polymer.

In the practice of this invention, it has been found that metals which intrinsically weakly bond with organic substrates, such as polymers, can be formed with enhanced adhesion to the substrates if intermixing between the metal atoms and the substrate is optimized. This is done by having the substrate temperature be within a critical range which is dependent upon the nature of the substrate. It has been found that if the substrate temperature is kept in a range between approximately 0.6 and 0.8 of the curing temperature $T_c$ of the material forming the substrate, and if a proper deposition rate is used, intermixing is optimized to provide strong adhesion between the deposited metal and the substrate. In particular, it is desirable that the metal atoms arrive at the substrate at a rate which is slow with respect to the rate of diffusion of the metal atoms into the substrate. If this occurs, optimum intermixing of the metal atoms and the substrate will occur over a distance of less than approximately 1000 angstroms into the substrate, and the adhesion of the metal to the substrate will be enhanced.

In general, when metal atoms arrive at a substrate, by processes such as evaporation, sputtering, etc., they can chemically bond to the substrate if they are strongly interacting with the substrate, or they can bond to one another if the rate of arrival of the metal atoms is rapid. If either of these events occurs, there will be little intermixing of the metal atoms within the substrate itself. For metal atoms which only weakly chemically bond with a substrate, it has been found that maximum adhesion to the substrate is produced only if there is optimum intermixing of the metal atoms and the substrate. While increased temperatures have been used in the past to enhance adhesion, it has now been found that there is a critical temperature range, less than the curing temperature, which will maximize adhesion of the metals to the substrate. If the substrate is kept at this critical temperature range during the early stages of metal deposition and, if the metal atoms arrive at a rate which is slow with respect to the rate of diffusion of these metal atoms into the substrate, optimum intermixing between the metal atoms and the substrate will occur and the adhesion will be maximized. After the intermixing has been optimized and a few atomic layers (30–50 angstroms) of continuous metal are formed on the substrate surface, the rest of the deposition can continue without critical concern with respect to the deposition conditions.

The adhesion of the metal film to the substrate is dependent on the amount of intermixing which occurs within a depth of approximately 1000 angstroms from the surface of the substrate, and more particularly to a depth of about a few hundred angstroms. To provide maximum adhesion, it is desirable that there be a relatively smooth gradient of metal atoms in the substrate over approximately a few hundred angstroms into the substrate. In particular, it has been found that if the arrival rate of the metal atoms on the substrate surface is approximately the same or less than the diffusion rate of metal atoms into the substrate, then intermixing will be optimized by controlling the the substrate deposition temperature, and optimum intermixing can occur in the top 1000 angstroms or less of the substrate, resulting in maximum adhesion.

Metals which can be deposited with maximum adhesion in accordance with this invention include Ni, Cu, and Al (even though Al is more somewhat strongly reactive with the substrate). Other metals which also can be deposited with maximum adhesion include Ag, Au, Ta, Pt, Ir, Rh, Pd, Zn, and Cd.

Substrates of particular interest in the practice of this invention include organic substrates having polymer chains, such as mylar (a trademark of E. I. duPont de Nemours, Inc.), polyimide, polyesters, epoxies, polyethylene, polystyrene, etc.

In the practice of this invention, the basic structure of the polymer does not seem to be altered, and the intermixing of the metal atoms in the polymer is primarily a process of metal diffusion into the polymer substrate. If chemical bonding between metal and polymer constituents were present, the likelihood of good adhesion to the substrate would be due to this bonding, but the invention has particular utility for use with those metal-substrate combinations where only very weak, or no, intrinsic chemical bonding to the substrate occurs.

In order to maximize adhesion between the metal and the substrate, it is desireable to have maximum intermixing of metal atoms and the substrate within a few hundred angstroms of the surface of the substrate (or to a maximum depth of about 1000 angstroms). One way to do this is to choose the substrate temperature and deposition rate so that a quasi equilibrium is obtained wherein the diffusion rate of metal atoms into the substrate occurs much more rapidly than the arrival rate of the metal atoms at the substrate. Following the general guideline of using a substrate temperature of approximately $(0.6-0.8)T_c$, the deposition rate is calculated with respect to the rate of diffusion of the metal atoms into the chosen substrate. Using this deposition rate, substrate temperature, and annealing time, a concentration of metal will be found in the first few hundred angstroms of the substrate. Once a few atomic layers of continuous metal are formed on the surface of the substrate, these substrate temperature and deposition rate conditions can be changed. It is only intermixing that occurs between metal atoms and the substrate which provides good adhesion.

Another way to provide maximum adhesion by optimizing intermixing is to use a fixed deposition rate and change the substrate temperature during deposition until the concentration of metal atoms is optimized in the top few hundred angstroms of the substrate. That is, measurements can be made of the substrate at different temperatures for a fixed deposition rate in order to determine the concentration of metal atoms in the substrate. This is done by known techniques, such as medium energy ion scattering (MEIS) and cross section transmission electron microscopy (TEM). When there is a concentration of metal atoms in the top few hundred angstroms of the substrate, the proper temperature of the substrate will be known for that deposition rate. Of course, if the deposition rate is too rapid, it can be reduced so that the process of metal atom diffusion in the substrate can occur for different substrate temperatures.

As a general guideline, deposition rates which provide optimum intermixing are less than about 10 angstroms/second, but can be higher if diffusion into the substrate occurs rapidly. For example, for the formation of copper or nickel layers on a polyimide substrate, deposition rates of a few (1–3) angstroms per second are preferred when the substrate temperature is 240°–280° C. These conditions can be maintained for about ½–2 minutes, which will produce a metal film of 30–60 angstroms thickness on the substrate. After that, the deposition conditions can be changed to more rapidly deposit the remaining thickness of metal film.

Figure 2:
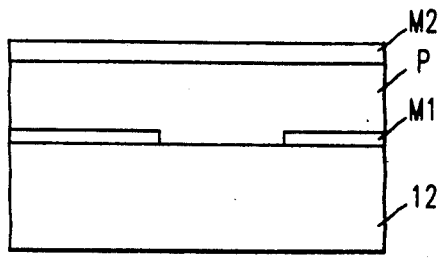
FIG. 2 is an illustration of a more complex structure in which a semiconductor, glass, or ceramic wafer includes overlying metal layers M1, M2 which are separated by a polymer insulator P, such as polyimide.

With these steps generally in mind, reference will now be made to the drawing. In particular, FIGS. 1 and 2 illustrate representative environments in which the invention can be practiced to provide improved structures. In FIG. 1, a substrate 10 has a metal layer M thereon. Substrate 10 is one of the organic substrates described hereinabove, while metal layer M is one of the aforementioned metals which weakly interact with polymer substrate 10.

FIG. 2 shows a structure of the type which might be present in a semiconductor circuit or package. Here, layer 12 can be a semiconductor, a glass, or a ceramic layer, etc. which has a first metallic coating M1 thereon, and a layer of electrically insulating material such as a polymer P. A polymer which is often used for this purpose is polyimide. Located on the polymer P is a second metal layer M2, which is a metal that weakly bonds with the polymer layer P.

In general, this invention relates to any type of structure including a metal-substrate combination, where the metal and the substrate are those which have been mentioned previously. This type of structure occurs in many different environments, such as those illustrated in FIG. 2.

EXAMPLES

In order to understand the application of the invention to different metal-substrate combinations, several examples will be presented. The first example is the deposition of copper onto polyimide. The copper layers were evaporated from small beads, molten onto a tungsten wire in vacuum. The evaporation rate was of the order of 2 angstroms per minute. The polyimide substrates were prepared by spinning a thin layer of polyimide onto an Al-coated Si substrate and then curing the sample (annealing in an inert gas ambient) to cause imidization. After mounting in the ultra high vacuum (UHV) chamber, the samples were annealed at 300° C. for five minutes to desorb the water present in the polyimide film. Copper was evaporated on these films at room temperature (25° C.), and at elevated temperatures. As will be seen, temperatures of 150° C., 250° C., and 300° C. were chosen. The ion scattering analysis to determine the presence of copper in polyimide was performed at room temperature.

After completion of the ion scattering experiments, the samples were taken out of the UHV chamber and further prepared for TEM analysis.

In these studies, medium energy ion scattering (MEIS) was used to characterize the polyimide-Cu interface prepared in UHV at temperatures between 300° and 600° K. Afterwards, the samples were studied with cross-section transmission electron microscopy (TEM) to obtain additional information on the interface morphology.

Figure 3:
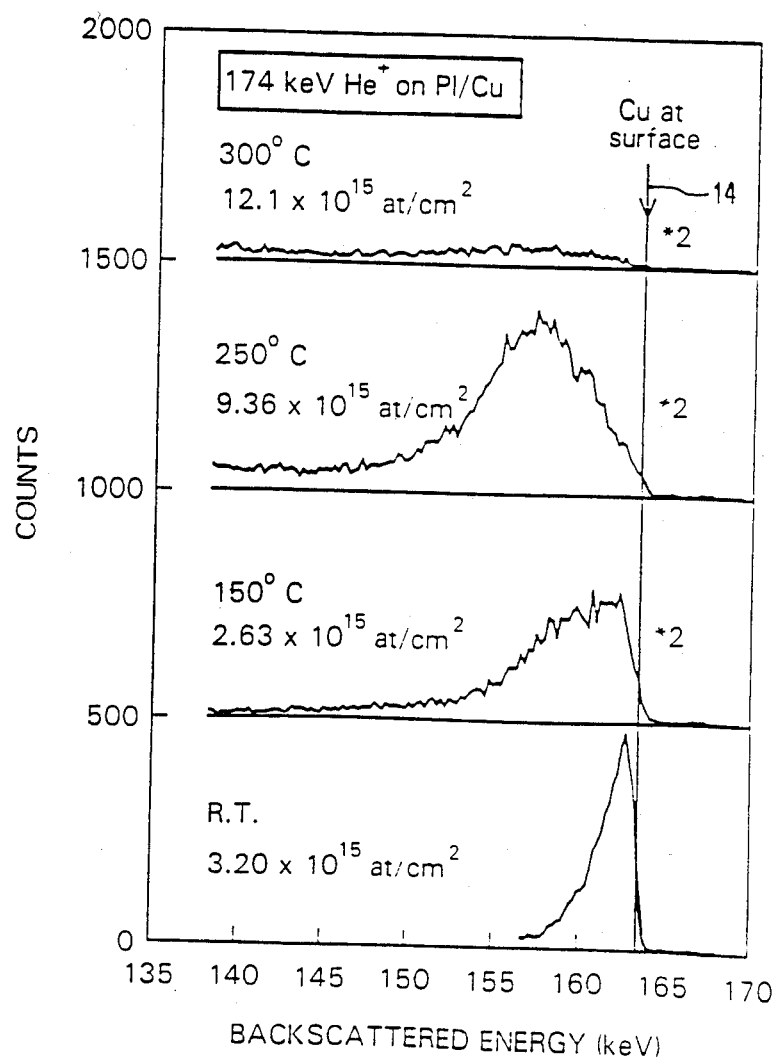
FIG. 3 illustrates the distribution of copper in a polyimide substrate, as a function of the substrate temperature, for four different substrate temperatures ranging from room temperature (25° C.) to 300° C. The number of copper atoms/cm² evaporated on the samples is indicated for each temperature.

FIG. 3 shows an energy spectrum for different samples of copper evaporated on polyimide. Samples were evaporated at room temperature (R.T.), 150° C., 250° C., and 300° C. The number of counts of backscattered ions is plotted against the backscattered energy for each of these four samples. The number of copper atoms/cm$^2$ evaporated on the samples is indicated for each substrate deposition temperature. Copper at the surface is indicated by the vertical line 14 at the right hand side of this energy distribution plot, while the numeral "2" is merely a scale factor. From these plots, it is evident that there is very little diffusion of copper into the polyimide when the polyimide is held at room temperature. In this case, most of the copper is present very close to the surface of the polyimide. When the substrate temperature is increased to 150° C., there is some diffusion of copper into the polyimide but the maximum amount of copper is found close to the surface of the polyimide. However, at 250° C., there is strong diffusion of copper into the polyimide and a maximum distribution of copper at some distance below the surface of the polyimide. This is a temperature in the range where optimum intermixing occurs.

At 300° C., there is strong diffusion of copper into the polyimide, but the temperature is sufficiently high that the copper diffuses evenly throughout the depth of the polyimide. This will not provide good adhesion since most of the copper merely diffuses into the depth of the polyimide and its concentration within a few hundred angstroms of the interface is insufficient for achieving good adhesion. In this situation, the diffusion rate into the polyimide is too high with respect to the arrival rate of copper atoms at the polyimide surface so that a quasi equilibrium of the type heretofore mentioned cannot be well established. From data on the peel strength of these films, the adhesion of copper films deposited at 300° C. is signficantly less than that of copper films deposited at 250° C. Thus, even though intermixing is greatly increased at 300° C. due to increased diffusion, the intermixing is not optimized and maximum adhesion does not result.

From the changes in the copper peak shapes it is clear that copper strongly diffuses into the polyimide. Even though the coverages at high temperatures are significantly larger than at low temperatures, the observed signal intensities are much smaller. This again is due to diffusion of copper deep into the polyimide. The tails of scattering intensity at lower energy are a direct indication of this diffusion. However, the depth distributions observed do not resemble simple diffusion profiles. In particular, the occurrence of a maximum concentration below the surface indicates that simple diffusion is not taking place. These spectra indicate the existance of copper clusters buried at the polyimide.

It appears that the copper forms clusters (spheres) at all of the temperatures which were studied. After deposition at 300° K., the copper spheres do not grow upon annealing. The copper atoms have become immobile and are only covered by a thin polyimide film upon annealing. However, with increasing deposition temperature the size of the copper spheres increases. At a given temperature, the spheres all have approximately the same size.

These observations can be explained by considering the low deposition rates used in the study. At 2 angstroms per minute, the copper atoms arrive at the polyimide surface one by one. They do not interact with other copper atoms arriving on the surface at the same time. The individual copper atoms do not have a strong chemical interaction with the polyimide. However, they can diffuse freely through the polyimide. The diffusion length of the copper in the polyimide is limited by the temperature. Thus, at room temperature the copper atoms do not diffuse very deeply into the polyimide, but at high temperatures they do. The copper atoms diffuse around until they meet other copper atoms with which they conform a cluster. Such clustering is favorable because of the cohesive energy of solid copper. Both the depth at which the copper spheres nucleate and the size of the spheres are related to the diffusion length. Chemical processes do not seem to be of any particular importance in the formation of the clusters, although they may occur at the cluster surfaces. The clusters have electronic properties very different from those of isolated copper atoms, and the associated chemistry may very well be different.

Figure 4:
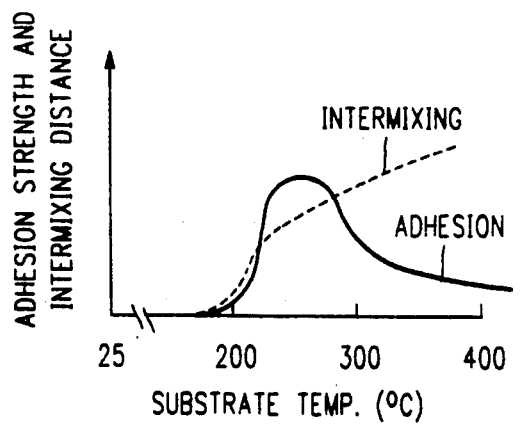
FIG. 4 is a schematic plot of adhesion strength and intermixing distance versus substrate temperature, which illustrates the discovery of the present invention.

Copper is characteristic of the types of metals which intrinsically weakly bond with these organic substrates. For these metals, there is a criticality of the substrate temperature with respect to intermixing and maximum adhesion. This critical temperature range occurs at temperatures less than the curing or glass transition temperatures of the substrate. These metalpolymer interfaces follow a physical characteristic, in contrast with those wherein stronger chemical processes occur. In the latter situation, these strong chemical processes are likely to arrest strong diffusion and give rise to much sharper interfaces which are less affected by the deposition temperature. In fact, this has been seen for the deposition of Cr on polyimide, wherein a critical temperature range for maximum adhesion, less than the substrate curing temperature, was not found. FIG. 4 plots adhesion strength and intermixing distance versus substrate temperature, and illustrates what is meant by optimum intermixing.

Intermixing is generally increased as substrate temperature increases, due to enhanced diffusion of metal atoms into the substrate. Thus, as this temperature increases, the distances into the substrate through which the metal atoms diffuse also increase. This is indicated by the dashed curve in FIG. 4, showing a generally increasing distance over which intermixing occurs.

However, where it would at first seem that maximum intermixing, and therefore maximum temperature, is needed to maximize adhesion of the metal to the substrate, such is not true. The solid curve, plotting adhesion strength, shows a maximum at temperatures less than the temperatures where intermixing distances are maximized. Thus, the amount of intermixing which yields maximum adhesion is termed "optimum" intermixing, and is that which occurs at temperatures in the range $(0.6-0.8)T_c$. This unexpected discovery forms the basis for the present invention.

Figure 5:
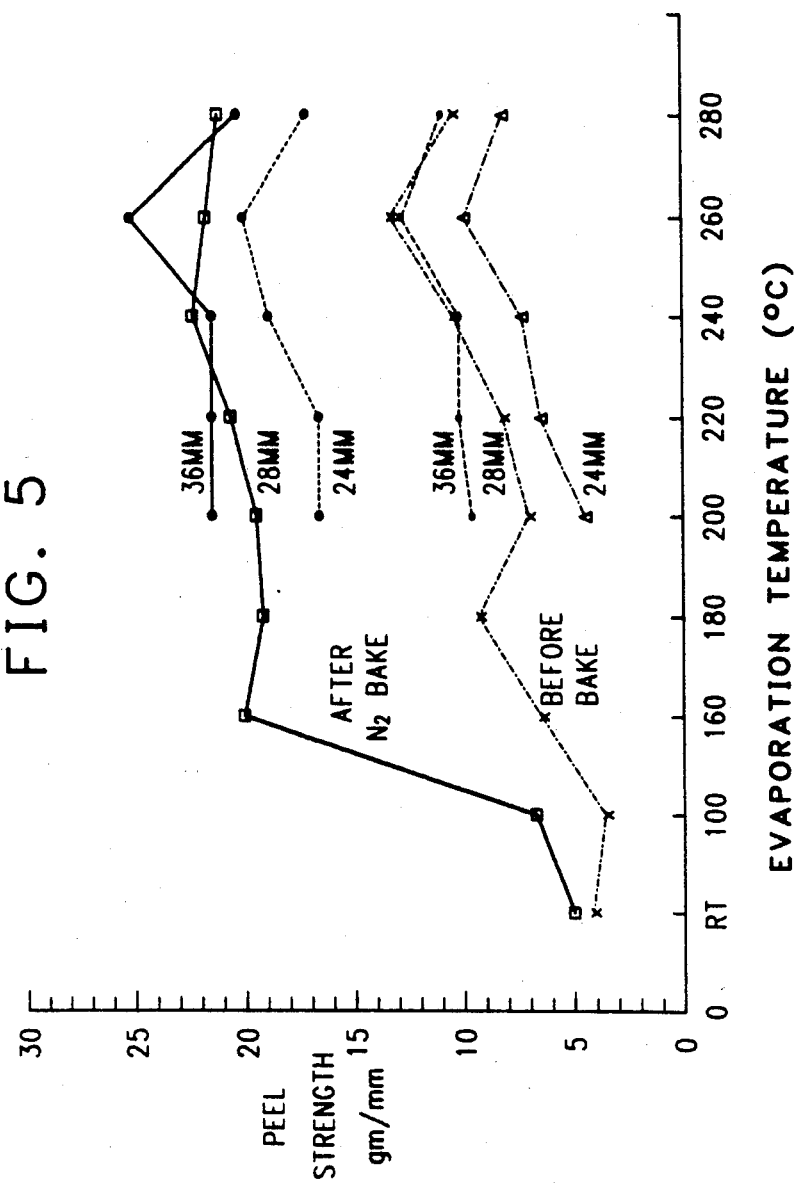
FIG. 5 is a plot of peel strength measured in grams per millimeter as a function of evaporation temperature, for copper strips of various widths evaporated onto polyimide substrates.
Figure 6:
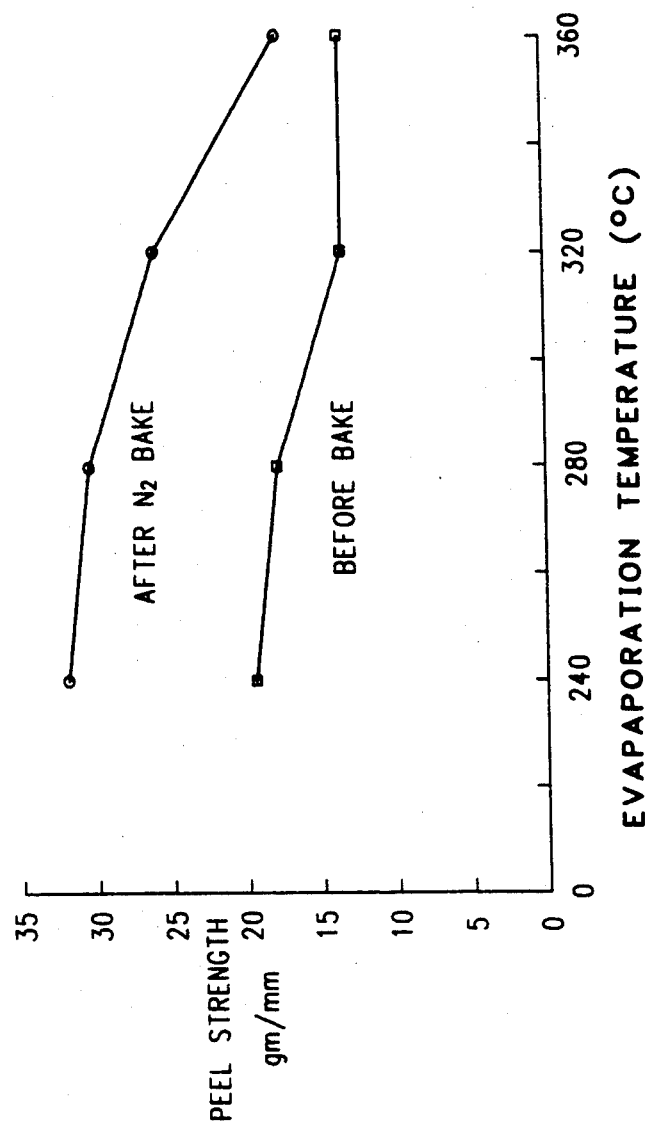
FIG. 6 is also a plot of peel strength versus evaporation temperature for a copper strip deposited on polyimide, in the temperature range 240°–360° C.

FIGS. 5 and 6 plot the peel strength, measured in grams per millimeter, against substrate evaporation temperature for copper samples of various widths deposited on polyimide. FIG. 5 covers the temperature range of room temperature (RT)-250° C. for some samples, while FIG. 6 covers the temperature range 240° C.-360° C. for other samples. The samples were measured before and after baking at 300° C. in a nitrogen atmosphere. From the curves of FIG. 5, it is apparent that a maximum adhesion strength for these samples exists at a temperature range 240°-280° C., and more particularly at approximately 260° C. This critical substrate range existed for all of the samples of copper on polyimide, regardless of the sample width.

FIG. 6 plots the peel strength of other copper samples on polyimide versus the substrate evaporation temperature, for four temperatures: 240°, 280°, 320°, and 360° C. Plots are shown for samples which have been nitrogen baked and for these samples before nitrogen baking. For these samples, the peel strength was maximized at a deposition temperature of 240° C., and diminished thereafter. The difference between these samples and those depicted in FIG. 5 relates to the different treatment given to each set of samples.

The second set of samples (FIG. 6) didn't go through the whole temperature range from approximately 100° C., so the overall behavior for these samples is not as clear. However, the results do indicate the degradation of adhesion due to excess diffusion at high temperatures. This means that an optimum intermixing is important.

In all of the samples studied, it was determined that intermixing of the metal and polyimide was optimized in the critical temperature range 240°-280° C. In particular, the metal/polymer intermixing was greater and more optimum than for samples deposited at 25° C. followed by annealing. This occurred in spite of the fact that the latter involved longer heat treatments than direct deposition in the temperature range 240°-280° C. The point is simply that it is intermixing during deposition which is important.

In further experiments, nickel was deposited on polyimide at different temperatures ranging from room temperature to 360° C. For nickel, it was found that maximum intermixing, and therefore adhesion, occurs at a critical temperature range less than the c-cure temperature (360° C.) commonly used to cure the polyimide substrate. The temperature range 240°-280° C. is also very favorable for nickel deposition. In the following Table I, copper and nickel were deposited on polyimide, and the peel adhesion strength of the samples in grams/mm was measured. This was done for samples deposited at different deposition temperatures, with and without post-annealing. The nickel samples were approximately 1000 angstroms thick, while the copper samples were 8 microns thick. The deposition rate for the copper and nickel samples was about 10 angstroms/second.

TABLE I

| | Metal/Polyimide Peel Adhesion Strength (g/mm) | | | | | | | | | |
|---|---|---|---|---|---|---|---|---|---|---|
| | DEPOSITION TEMPERATURE (°C.) | | | | | | | | | |
| ME- | 25 | | 240 | | 280 | | 320 | | 360 | |
| TAL | (a) | (b) | (a) | (b) | (a) | (b) | (a) | (b) | (a) | (b) |
| Cu | — | — | 18.4 | 32.3 | 16.1 | 29.6 | 11.8 | 25.0 | 11.5 | 15.4 |
| Ni | 0.9 | 0.7 | — | — | 36.2 | 32.0 | — | — | 10.1 | 9.1 |

(a) without post-annealing
(b) with post-annealing at 360° C./ 30 min:
Cu: in nitrogen atmosphere
Ni: in 1 × 10$^{-6}$ torr vacuum Substrate heating is used shortly before (one hour or less) metal deposition, and during metal deposition. Of course, once a few atomic layers of continuous metal are formed on the substrate surface, intermixing is complete and the substrate temperature as well as the deposition rate can be changed to continue growing the rest of the film.

Although the increased adhesion of these metals to the substrate can be explained by enhanced intermixing, recent ultraviolet and x-ray photoemission studies have demonstrated particular changes in the chemical and material characteristics of the polyimide surface and the metal-polymer interface at these critical temperature ranges, as compared to both higher and lower temperatures. These changes may explain the results of Table I.

Table II shows data corresponding to other Ni-polyimide interfaces where the adhesion strength has been measured as a function of deposition temperature and diffusion annealing. As with the data of Table I, the present data indicates that maximum peel adhesion strength was found for deposition at 280° C., for all samples, i.e., without regard to the annealing process. This high peel adhesion strength for samples deposited at 280° C. was found to be maintained even under a very detrimental temperature and humidity (T and H) test which subjected the samples to 1000 hours at 85° C. and 80% relative humidity. For these samples, the nickel was deposited at different temperatures after the substrate was heated for about 20 minutes prior to evaporation of the nickel.

TABLE II

Polyimide-Ni/Cu Peel Adhesion Strength (in gr/mm) as a Function of Deposition Temperature and Diffusion Annealing

| ANNEALING SCHEDULE | SPECIMEN NO. | SPECIMEN GROUP | | |
|---|---|---|---|---|
| | | A* | B* | C* |
| As received (No Annealing) | 1 | 11.8 | 35.4 | 1.0 |
| | 2 | 9.3 | 37.1 | .9 |
| 405° C./15 min | 3 | 10.2 | 27.1 | .7 |
| | 4 | 9.9 | 32.2 | .7 |
| 20 min | 5 | 7.2 | 32.8 | — |
| | 6 | 9.6 | 29.1 | .8 |
| 40 min | 7 | 11.8 | 27.8 | .8 |
| | 8 | 9.8 | 35.1 | .7 |
| 360° C./15 min | 9 | 7.3 | 27.0 | .8 |
| | 10 | 8.1 | 29.5 | .8 |
| 30 min | 11 | 9.5 | 32.8 | .7 |
| | 12 | 8.7 | 31.2 | .7 |
| 60 min | 13 | 10.2 | 33.5 | .7 |
| | 14 | 6.2 | 30.6 | .7 |
| 280° C./20 min | 15 | 10.1 | 19.2 | .8 |
| | 16 | 10.0 | 27.3 | .9 |
| 40 min | 17 | 10.5 | 33.5 | — |
| | 18 | 7.1 | 24.7 | .9 |
| 90 min | 19 | 9.8 | 34.8 | .9 |
| | 20 | 9.8 | 33.6 | — |
| T & H/1000 hr | 21 | 9.3 | 28.7 | 1.2 |
| | 22 | 9.1 | 33.2 | 1.4 |

*The substrate temperatures of specimens A, B and C during metallization were 360, 280 and 25° C. respectively.

In the practice of this invention, the technique for depositing metal atoms is not critical. Any technique, such as evaporation or sputtering, can be used. Also, the results showing improved adhesion at critical substrate temperatures less than the curing temperature remain, regardless of post deposition conditions (such as post-annealing). The important factor is the optimization of intermixing during the initial stages of metal deposition.

What has been described are structures and techniques for providing maximum adhesion between a certain class of metals and polymer substrates on which the metals are deposited. These are metals which weakly bond or do not bond at all to the substrates. A possible exception in this metal group is Al, which does exhibit some weak bonding to the substrate constituents, but which undergoes enhanced intermixing in the critical temperature range.

The temperature range of approximately $(0.6-0.8)\ T_c$ is substantially definite, but does include some leeway in it, such as a few degrees outside $0.6\ T_c$ and $0.8\ T_c$.

For example, for polymers with very low curing temperatures, such as polyethylene for which $T_c$ is about 200°, a usable upper temperature can approach $0.85\ T_c$.

While the invention has been described with respect to particular embodiments thereof, it will be appreciated by those of skill in the art that other embodiments can be envisioned within the spirit and scope of this invention. For example, combinations of these metals can be deposited at the same time onto the substrates, and the substrate temperatures can be adjusted within the critical temperature range for different deposition rates, in order to tailor the amount of adhesion between the metal and the substrate. Also, the invention can be used in any type of application such as, for example, packaging, circuitry, printing, etc.

Having thus described our invention, what we claim as new and desire to secure by Letters Patent is:

1. A method for producing a metal-organic substrate composite with increased adhesion between the metal and the organic substrate, where the metal has only weak intrinsic bonding to the organic substrate, including the steps of:

heating the organic substrate to a temperature approximately 0.6–0.8 of its curing temperature $T_c$, and depositing said metal onto said organic substrate while said substrate is heated to a substrate temperature within the range of about $(0.6-0.8)\ T_c$ until at least a few atomic layers of continuous metal are formed on said substrate, said deposition occurring at a rate such that the diffusion of depositing metal atoms into said organic substrate is equal to or greater than the arrival rate of said metal atoms at the surface of said organic substrate, said metal being one which has only weak chemical bonding to the atomic constituents of said organic substrate.

2. The method of claim 1, wherein said metal is selected from the group consisting of Ni, Cu, and Al.

3. The method of claim 1, where said metal deposition rate does not exceed about 1/10 of the diffusion rate of said metal atoms into said organic substrate.

4. The method of claim 1, where said metals are selected from the group consisting of Ni, Cu, Al, Ag, Au, Ta, Pt, Ir, Rh, Pd, Zn, and Cd.

5. The method of claim 1, where said substrate is an organic polymer.

6. The method of claim 1, where said substrate is polyimide.

7. A method for depositing a metal onto an organic polymer substrate in order to maximize the adhesion between the metal and the substrate, including the steps of:

heating said organic polymer substrate to a temperature approximately $(0.6-0.8)$ of its curing temperature $T_c$, depositing on said organic polymer substrate a metal selected from the group consisting of Ni, Cu, Al, Au, Ag, Ta, Rh, and Pd, said substrate being heated to a temperature within the approximate range $(0.6-0.8)\ T_c$ during the deposition of said metal thereon at least until a few atomic layers of a continuous metal film are formed on the surface of said substrate, said substrate temperature and the deposition rate of metal atoms onto said substrate being chosen such that intermixing of metal atoms and said substrate is optimized to a distance less than about 1000 angstroms into said substrate to maximize adhesion between said metal and said substrate.

8. The method of claim 7, where said substrate is polyimide.

9. The method of claim 8, wherein the arrival rate of metal atoms at the surface of said organic polymer substrate does not exceed the diffusion rate of said metal atoms into said organic polymer substrate.

10. The method of claim 8, where said metal atoms are deposited by evaporation or sputtering.

11. A method for making a metal layer-organic substrate composite having increased adhesion between the metal layer and the organic substrate, including the steps of heating said organic substrate to a temperature approximately (0.6–0.8) of its curing temperature $T_c$, depositing thereon a metal selected from the group consisting of Ni, Cu, Al, Ag, Ta, Pt, Ir, Rh, Pd, Zn, and Cd, said deposition being at a rate sufficiently slow that diffusion of metal atoms into said organic substrate can occur, said organic substrate being heated to a temperature in the approximate range (0.6–0.8) $T_c$ during said deposition for a time sufficiently long to allow optimum intermixing between said metal and the atomic constituents of said substrate over a distance less than about 1000 angstroms into said organic substrate in order to maximize adhesion between said metal and said substrate.

12. The method of claim 11, where said organic substrate is polyimide.

13. The method of claim 11, where said substrate is an organic polymer.

14. The method of claim 13, where said deposition rate is less than the diffusion rate of metal atoms into said substrate.

15. The method of claim 1, where said substrate is selected from the group consisting of mylar, polyimide, polyesters, polyethylene, epoxies, and polystyrene.

16. A method for producing a metal-polyimide composite having good adhesion between said metal and polyimide, comprising the steps of:

depositing a metal selected from group consisting of Cu, Ni, and Al onto said polyimide while said polyimide is heated to a temperature in the range of about (0.6–0.8) $T_c$, where $T_c$ is the curing temperature of said polyimide, and adjusting the rate of arrival of atoms of said metal at the surface of said polyimide to be about equal to or less than the diffusion rate of said metal atoms into said substrate.

17. The method of claim 16, where said rate of arrival of said metal atoms does not exceed about 0.1 of said diffusion rate.

* * * * *